United States Patent
Gregoritsch, Jr.

(10) Patent No.: US 7,719,295 B2
(45) Date of Patent: May 18, 2010

(54) METHOD AND APPARATUS FOR IMPLEMENTING IC DEVICE TESTING WITH IMPROVED SPQL, RELIABILITY AND YIELD PERFORMANCE

(75) Inventor: Albert J. Gregoritsch, Jr., South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 329 days.

(21) Appl. No.: 11/669,188

(22) Filed: Jan. 31, 2007

(65) Prior Publication Data

US 2008/0180109 A1    Jul. 31, 2008

(51) Int. Cl.
*G01R 31/302* (2006.01)

(52) U.S. Cl. .................. 324/750; 324/765

(58) Field of Classification Search ........... 324/760, 324/763, 765, 750, 205
See application file for complete search history.

(56) References Cited

U.S. PATENT DOCUMENTS

| | | | |
|---|---|---|---|
| 4,050,010 A | | 9/1977 | Isnard |
| 4,975,637 A | * | 12/1990 | Frankeny et al. ............ 324/760 |
| 5,777,901 A | * | 7/1998 | Berezin et al. ............... 716/19 |
| 5,946,214 A | * | 8/1999 | Heavlin et al. .............. 700/121 |
| 6,031,773 A | | 2/2000 | Taylor |
| 6,114,181 A | | 9/2000 | Gregoritsch, Jr. |
| 6,345,211 B1 | | 2/2002 | Yu |
| 6,404,219 B1 | | 6/2002 | Yamamoto |
| 6,529,029 B1 | * | 3/2003 | Bruce et al. ................. 324/765 |
| 6,579,612 B1 | * | 6/2003 | Lille ......................... 428/332 |
| 6,719,615 B1 | | 4/2004 | Molnar |
| 6,873,932 B1 | | 3/2005 | Kim |
| 6,925,202 B2 | | 8/2005 | Karklin et al. |
| 7,008,300 B1 | | 3/2006 | Molnar |
| 7,116,094 B2 | * | 10/2006 | Levin et al. ............. 324/117 H |
| 2002/0171420 A1 | * | 11/2002 | Chaparala et al. ........... 324/225 |
| 2004/0175851 A1 | * | 9/2004 | Abadeer et al. .............. 438/17 |
| 2005/0012576 A1 | * | 1/2005 | Wei et al. ...................... 335/78 |
| 2005/0099200 A1 | * | 5/2005 | Furukawa et al. ........... 324/765 |
| 2005/0138496 A1 | | 6/2005 | Brennan et al. |
| 2006/0164115 A1 | * | 7/2006 | Komiya et al. .............. 324/765 |
| 2006/0203590 A1 | * | 9/2006 | Mori et al. .................. 365/222 |
| 2006/0284629 A1 | * | 12/2006 | Wei et al. .................... 324/754 |

* cited by examiner

*Primary Examiner*—Ha Tran T Nguyen
*Assistant Examiner*—Arleen M Vazquez
(74) *Attorney, Agent, or Firm*—Cantor Colburn LLP; Michael LeStrange

(57) ABSTRACT

A method for testing an integrated circuit device includes subjecting the integrated circuit device to an applied magnetic field during the application of one or more test signals, the applied magnetic field inducing magnetostriction effects in one or more materials comprising the integrated circuit device; and determining the existence of any defects within the integrated circuit device attributable to the applied magnetic field.

20 Claims, 3 Drawing Sheets

METHOD AND APPARATUS FOR IMPLEMENTING IC DEVICE TESTING WITH IMPROVED SPQL, RELIABILITY AND YIELD PERFORMANCE

BACKGROUND

The present invention relates generally to integrated circuit device testing techniques and, more particularly, to a method and apparatus for implementing integrated circuit (IC) device testing with improved SPQL (shipped product quality level), reliability and yield performance.

The traditional integrated circuit fabrication process is a series of steps by which a geometric pattern or set of geometric patterns is transformed into an operational integrated circuit. An integrated circuit consists of superimposed layers of conducting, insulating, and device-forming materials. By arranging predetermined geometric shapes in each of these layers, an integrated circuit that performs the desired function may be constructed. The overall fabrication process consists of the patterning of a particular sequence of successive layers.

Defects in integrated circuit structures may be caused by many factors. Some defects are due to imperfections in the underlying semiconductor crystalline structure, while others are caused by imperfections in the physical structure of the circuit components and connections. For instance, a "dislocation" is a physical defect in the structure of the semiconductor crystal (e.g., silicon) at a very small scale. A dislocation may involve as few as four or five silicon atoms oriented differently than the other atoms in the crystal. A dislocation can impair the electrical function of a chip by causing threshold voltage shifts or leakage current. However, due to the nature of most dislocations, a dislocation is not easily detected. Furthermore, since the electrical activity of a dislocation defect can increase with the passage of time/accumulated charge, the continued application of heat and voltage after fabrication can cause circuit failure.

In addition to dislocation type defects mentioned above, other defects may also occur at contact points within a circuit or module. A contact point is the region located at the top or bottom of an opening between layers that allows an electrical contact to be made to individual layers. These contact points may become stressed during the fabrication process and develop an undesirable resistance to the passage of electrical current that may ultimately impede circuit performance. Ideally, these contact points will transmit an electrical current or signal with very little or no resistance. However, as these contact points develop increased resistance, they may eventually prevent the components within an integrated circuit from responding correctly. In an extreme case, a contact point may be so damaged as to create an open circuit, leading to an inoperative circuit or device. Damage to the contact points may be caused by stresses such as heating and cooling.

Another type of defect that can adversely affect circuit performance is what is known as a "stacking fault." A stacking fault occurs when there are localized partial displacements of closely packed silicon planes that upset the normal crystal lattice structure. Stacking faults are common in integrated circuits and tend to increase as the device density increases. Yet another common defect is what is known as a "high resistance strap." In general, a strap is a layer of doped polysilicon that is used as an interconnection between components of a chip. A strap may have a constriction or crack in the polysilicon that results in the strap having a higher than normal resistance. Still another known type of defect in integrated circuit devices the existence in micro-cracked metallurgy formed over topographic device features and in via structures.

Each of the various types of manufacturing defects discussed above gives rise to decreased yield, increased "shipped product quality level" or "SPQL" (which is a metric describing the ratio of bad parts shipped to total parts shipped—as discovered by a customer), and increased device failures over time in the field (i.e., decreased reliability). Accordingly, one existing solution to address at least some of these metrics is the implementation of module level burn-in testing, which is designed to find defects in an integrated circuit.

Generally speaking, burn-in testing includes subjecting a circuit to a higher than normal voltage and temperature to stress the circuit components. Burn-in testing can be performed directly in-situ on the wafer, or at a later time such as when the individual integrated circuits have been packaged and incorporated into a finished module, component, or product. For example, once a wafer has been processed, the overall wafer is tested for defects. A probe device is connected to the contact pads for each die located on the periphery or spine of the individual integrated circuits. This allows each integrated circuit to be connected to an electrical source and a reference ground to supply an operational current.

The wafer is typically tested at voltage levels approximately 1.5 times the rated nominal value. For example, a typical circuit on a wafer may be designed to operate with a supplied voltage level of approximately 3.3 volts. Therefore, in this specific example of burn-in testing, the circuit will be operated at a voltage level of approximately 5-6 volts. This enhanced voltage level will create a flow of electricity and enhanced electric fields throughout the circuit which are greater than normal. While this stress is greater than the stress applied to the circuits during normal operations, the applied levels of current and the resulting electrical fields are controlled during burn-in testing so that they will not adversely affect the integrated circuit, but will only trigger defects so that they may be located and eliminated.

During the burn-in testing period, the circuitry on the wafer is electrically "exercised" or tested. However, due to the nature of certain defects, many of the defects listed above may not be readily apparent during standard burn-in testing. This is because the effects of many common defects increase only with the passage of time/accumulated charge, or with the continued application of heat and/or voltage to the affected components. As such, conventional module level burn-in provides limited success at the expense of yield.

Another solution, described by the Applicant of the present application in U.S. Pat. No. 6,114,181 (and assigned to the assignee of the present application) also involves module level burn-in, but in an environment that further simulates a card attach process step into the fabrication process, prior to conventional module burn-in testing. In other words, this technique essentially emulates customer activity by introducing a "thermal bump" step into the burn-in process that simulates the temperature conditions experienced when a chip is attached to a circuit card. In this manner, the thermal bump induces or accelerates the failure of certain weak modules and thus allows for identification of faulty modules during subsequent reliability testing steps, thereby resulting in a reduced SPQL as well as better reliability.

Notwithstanding the above described testing techniques, however, it would be desirable to implement even further improvements in integrated circuit device testing techniques that result in improved SPQL and reliability performance, but also in a manner that maintains/improves yield performance as well.

SUMMARY

The foregoing discussed drawbacks and deficiencies of the prior art are overcome or alleviated by a method for testing an integrated circuit device. In an exemplary embodiment, the method includes subjecting the integrated circuit device to an applied magnetic field during the application of one or more test signals, the applied magnetic field inducing magnetostriction effects in one or more materials comprising the integrated circuit device; and determining the existence of any defects within the integrated circuit device attributable to the applied magnetic field.

In another embodiment, a method for testing an integrated circuit device includes subjecting the integrated circuit device to an applied magnetic field during the application of one or more test signals, the applied magnetic field inducing magnetostriction effects in one or more materials comprising the integrated circuit device, wherein the induced magnetostriction effects electrically activate one or more of: stacking faults, dislocations, and microcracks present within the integrated circuit device; measuring a change in a selected property of one or more elements within the integrated circuit device as a result of the applied magnetic field; determining the existence of any defects within the integrated circuit device attributable to the applied magnetic field; and implementing a redundancy scheme to repair one or more of any determined defects within the integrated circuit device.

In still another embodiment, an apparatus for testing an integrated circuit device includes a controller configured for providing power and test signals to the integrated circuit device; and a magnetic field source configured to apply a magnetic field to the integrated circuit device, wherein the applied magnetic field is configured to induce magnetostriction effects in one or more materials comprising the integrated circuit device; and wherein the controller is configured to facilitate determination of the existence of any defects within the integrated circuit device attributable to the applied magnetic field.

BRIEF DESCRIPTION OF THE DRAWINGS

Referring to the exemplary drawings wherein like elements are numbered alike in the several Figures.

DETAILED DESCRIPTION

Disclosed herein is a method and apparatus for implementing integrated circuit device testing with improved SPQL, reliability and yield performance. Briefly stated, a magnetic field is applied to a device under test (e.g., during wafer final test or just prior to final test). An effect of such an applied magnetic field is to electrically activate, through magnetostriction of the device materials, any silicon defects present within the IC, as well as to impart additional stress/strain on any micro-crack structures present within the device. The applied magnetic field technique disclosed herein can also be used in conjunction with the simulated mechanical/thermal stress/shock of a card attach process as described in U.S. Pat. No. 6,114,181, the contents of which are incorporated herein in their entirety.

Magnetostriction of silicon/$SiO_2$ materials or other dipolar molecules present within an IC device (as well as an electric to magnetic field interaction) is noted to trigger electrical activity of stacking faults/dislocations, microcracks, etc., present therein. Advantageously, where a magnetic field is applied at or before wafer final testing, any resulting fails discovered at this point may be remedied by implementing a redundancy operation (e.g., programming of fuses to disable failed elements and create new circuit paths to activate redundant circuit elements). Accordingly, by inducing defects to fail earlier in the testing process, the failed elements (e.g., memory cells) may be replaced with redundant elements such that yield, SPQL, and reliability are all improved.

Figure 1:
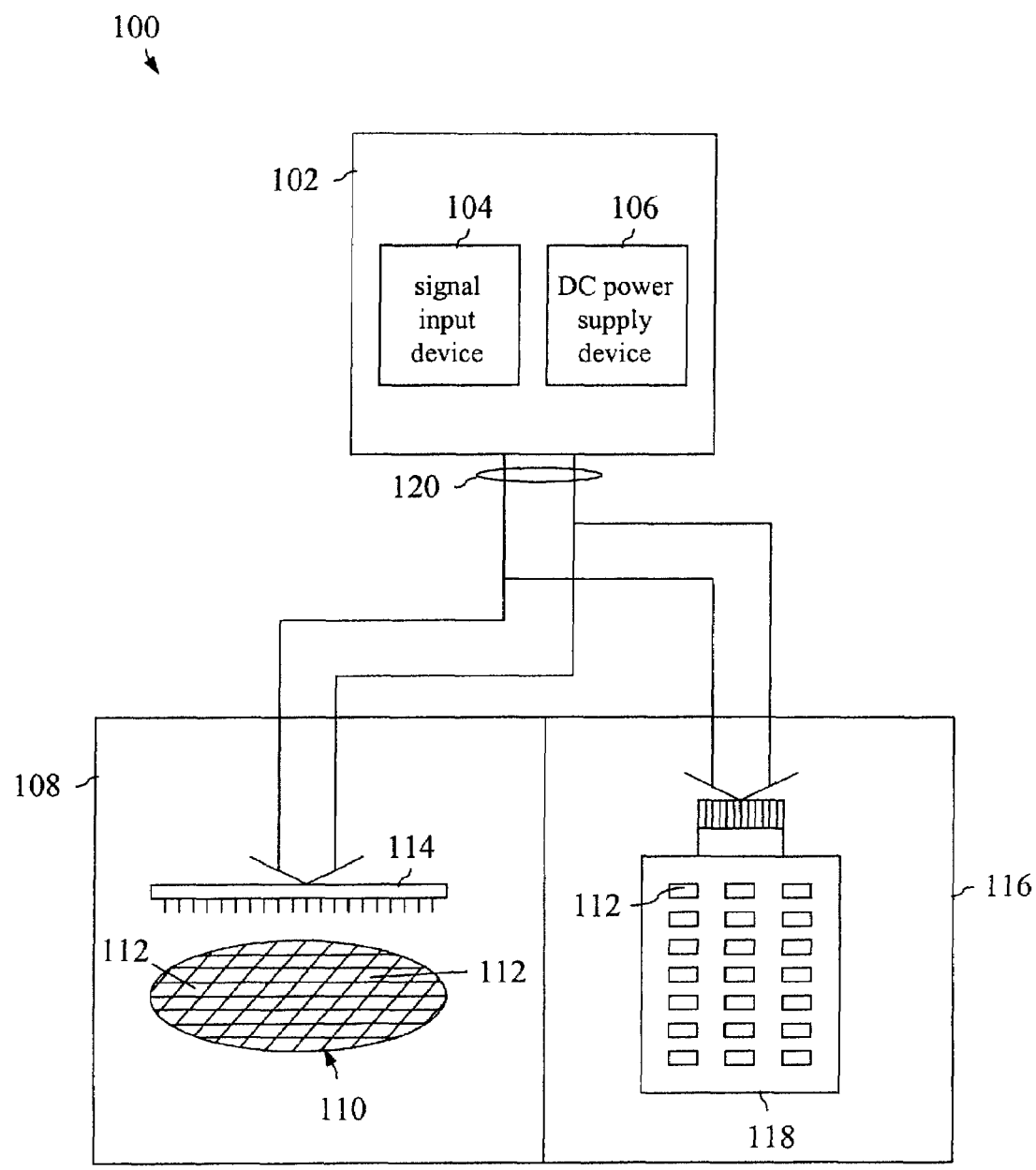
FIG. 1 is a schematic block diagram of an existing burn-in testing apparatus.

Referring initially to FIG. 1, a schematic block diagram of an existing burn-in test apparatus 100 is illustrated. The burn-in test apparatus 100 includes a controller 102 housing a signal input device 104 and a DC power supply device 106. In addition, a wafer-level test chamber 108 is configured to accommodate a wafer 110 mounted on a thermal chuck (not shown), with the wafer 110 having a plurality of individual semiconductor chips 112 formed thereupon. A probe card 114 configured with individual probe needles is configured to probe connections to the semiconductor chips 112. Further, a package-level thermostatic chamber 116 has a burn-in circuit board 118 provided therein. Power and signal lines 120 connect the controller 102 to both the probe card 114 in the wafer-level test chamber 108 and the burn-in circuit board 118 in the thermostatic chamber 116.

A wafer burn-in test is performed by supplying power supply voltages and control signals from the controller 102 to the semiconductor chips 112 on the wafer 110 via the power/signal lines 120 that are connected to the probe card 114. A package burn-in test is performed in a manner such that the packaged semiconductor chips 112 are mounted on the burn-in circuit board 118, with the appropriate power supply voltages and control signals also supplied via the power/signal lines 120.

As indicated previously, many of the defects listed above may not be readily apparent during standard burn-in testing since the effects of many common defects increase only with the passage of time/charge accumulation, or with the continued application of heat and/or voltage to the affected components. Thus, conventional module level burn-in using a device such as shown in FIG. 1 provides limited success at the expense of yield.

Figure 2:
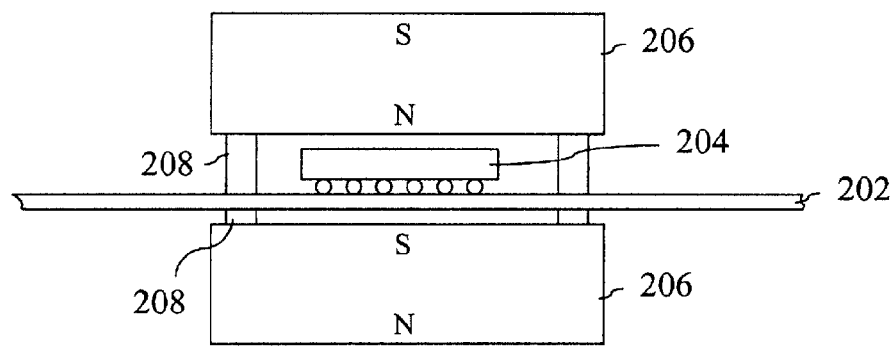
FIG. 2 is a schematic diagram of a burn-in board (BIB) modified to provide a magnetic field to an integrated circuit device under test, in accordance with an exemplary embodiment of the invention.

Accordingly, FIG. 2 a schematic diagram of a burn-in board (BIB) modified to provide a magnetic field to an integrated circuit device under test, in accordance with an exemplary embodiment of the invention. As shown therein, the BIB 202 is depicted with a packaged module 204 attached thereto. In addition, a pair of permanent magnets 206 is also attached to the BIB 202 through spacers 208. The semiconductor device in the module 204 is thus subjected to magnetostriction effects due to the applied field.

Example

Using an apparatus, such as shown in FIG. 2, data was generated using a 16-meg embedded DRAM (8SF technology) macro that was found to exhibit a variable retention time (VRT) fail. Variable retention time is a phenomenon driven by dislocations and stacking faults. The module was subsequently operated under the influence of a magnetic field. Results showed that the VRT fail was immediately discovered at the same failing address while, in contrast, the original testing activity that initially identified it as a "fail" took several hours of special operation using conventional module burn-in techniques to detect. Moreover, upon deactivation (removal) of the magnetic field source, the VRT fail was noted to have recovered.

Figure 3:
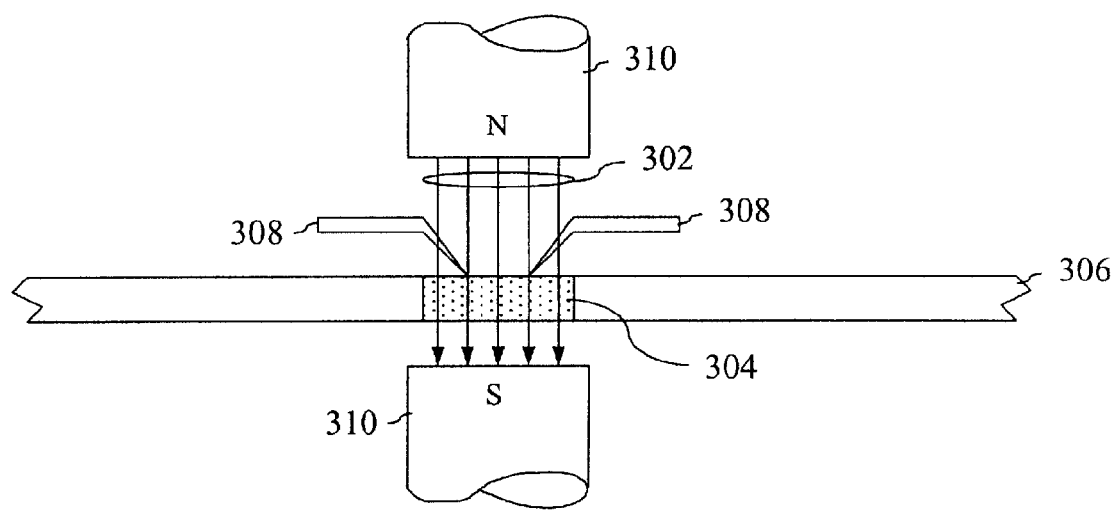
FIG. 3 is a schematic diagram of a probed semiconductor wafer under test, having a magnetic field applied thereto, in accordance with another exemplary embodiment of the invention.

Referring now to FIG. 3, a schematic diagram of a probed semiconductor wafer under test, having a magnetic field applied thereto, is illustrated in accordance with another exemplary embodiment of the invention. In this example, a magnetic field (depicted by flux lines 302) is applied during wafer level testing of a chip 304 formed on a semiconductor wafer 306. The chip 304 (shaded region of the wafer 306) is illustrated with exemplary probe needles 308 attached thereto. It will be appreciated that the exemplary magnet 310 depicted in FIG. 3 need not be a permanent magnet device, but also be an electromagnet. Moreover, the specific polarity depicted therein is presented by way of example only, and it is contemplated that a magnetic field of alternating polarity and/or flux angle may also be used to initiate magnetostriction effects in the wafer/chip to electrically activate latent dislocations and the like.

Figure 4:
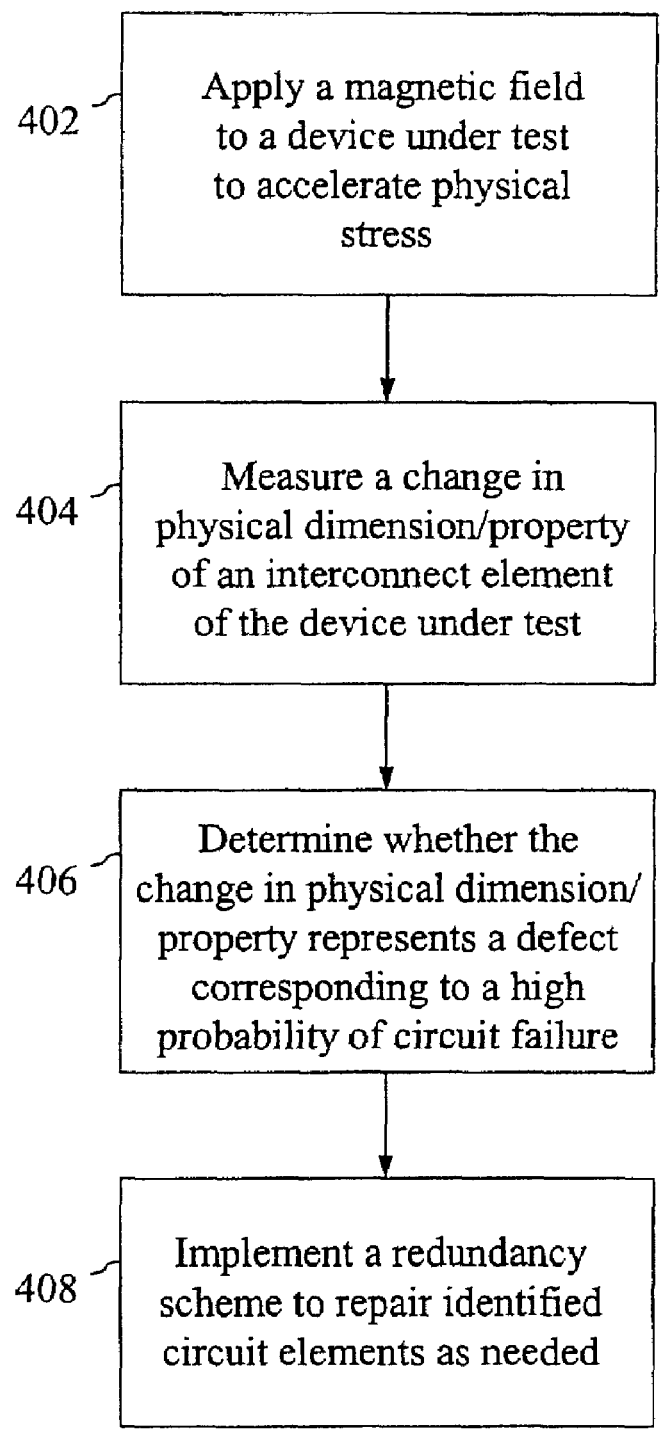
FIG. 4 is a process flow diagram illustrating a method for implementing integrated circuit device testing with improved SPQL, reliability and yield performance, in accordance with a further embodiment of the invention.

FIG. 4 is a process flow diagram illustrating a method 400 for implementing integrated circuit device testing with improved SPQL, reliability and yield performance, in accordance with a further embodiment of the invention. As shown in block 402, a magnetic field is applied to a device under test in order to accelerate physical stresses by magnetostriction effects, as discussed above. The testing may encompass both wafer level testing as well as package level testing.

In block 404, a change in physical dimension and/or property of a selected element (e.g., an interconnect) of the device under test is then measured. One example of such a property may be the VRT of a single storage cell of a memory device (e.g., DRAM). Then, as shown in block 406, the method 400 determines whether the measured change represents a defect corresponding to a high property of circuit failure. This would depend on, for example, the nature of the measured dimension/property and the degree to which the change due to magnetostriction induced stress impacts the electrical properties and performance of the selected element.

Finally, as reflected in block 408, upon discovery of a defect corresponding to a high probability of circuit failure, available redundancy schemes may be implemented to remove the defective element from operation in the circuit. In so doing, the magnetic field induced stress technique can identify those defects that would not otherwise be caught prior to shipping of the product to a customer. This both reduces SPQL and increases reliability of the component over time. Moreover, since these magnetically induced stress related defects are discovered by the manufacturer instead of the customer, there is the capability of invoking redundancy schemes associated with integrated circuit device products (such as embedded DRAM, for example), which improves yield since the component may be repaired and shipped instead of being scrapped.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for testing an integrated circuit device, the method comprising:

subjecting the integrated circuit device to an applied magnetic field during the application of one or more test signals, the applied magnetic field inducing magnetostriction effects in one or more materials comprising the integrated circuit device, wherein the magnetostriction effects induced in the integrated circuit device electrically activate any silicon defects present therein, and impart additional stress or strain on any micro-crack structures present within the integrated circuit device; and determining the existence of any defects within the integrated circuit device attributable to the magnetostriction effects caused by the applied magnetic field.

2. The method of claim 1, wherein the magnetic field is applied during wafer level testing.

3. The method of claim 1, wherein the magnetic field is applied during package level testing.

4. The method of claim 1, wherein the magnetic field is applied using a permanent magnet.

5. The method of claim 1, wherein the magnetic field is applied using an electromagnet.

6. The method of claim 1, wherein the magnetic field is applied during burn-in testing of the integrated circuit device.

7. A method for testing an integrated circuit device, the method comprising:

subjecting the integrated circuit device to an applied magnetic field during the application of one or more test signals, the applied magnetic field inducing magnetostriction effects in one or more materials comprising the integrated circuit device, wherein the inducted magnetostriction effects electrically activate one or more of: stacking faults, dislocations, and microcracks present within the integrated circuit device, wherein the magnetostriction effects induced in the integrated circuit device electrically activate any silicon defects present therein, and impart additional stress or strain on any micro-crack structures present within the integrated circuit device;

measuring a change in a selected property of one or more elements within the integrated circuit device as a result of the applied magnetic field;

determining the existence of any defects within the integrated circuit device attributable to the magnetostriction effects caused by the applied magnetic field; and implementing a redundancy scheme to repair one or more of any determined defects within the integrated circuit device.

8. The method of claim 7, wherein the magnetic field is applied during wafer level testing.

9. The method of claim 7, wherein the magnetic field is applied during package level testing.

10. The method of claim 7, wherein the magnetic field is applied using a permanent magnet.

11. The method of claim 7, wherein the magnetic field is applied using an electromagnet.

12. The method of claim 7, wherein the magnetic field is applied during burn-in testing of the integrated circuit device.

13. The method of claim 7, wherein a selected property of one or more elements within the integrated circuit device includes variable retention time (VRT) failure of a memory storage cell.

14. The method of claim 7, wherein determining the existence of any defects within the integrated circuit device attributable to the applied magnetic field includes analysis of the probability of device failure due to the measured change in the selected property of the one or more elements within the integrated circuit device as a result of the applied magnetic field.

15. An apparatus for testing an integrated circuit device, comprising:
a controller configured for providing power and test signals to the integrated circuit device; and
a magnetic field source configured to apply a magnetic field to the integrated circuit device, wherein the applied magnetic field is configured to induce magnetostriction effects in one or more materials comprising the integrated circuit device, wherein the magnetostriction effects induced in the integrated circuit device electrically activate any silicon defects present therein, and impart additional stress or strain on any micro-crack structures present within the integrated circuit device; and
wherein the controller is configured to facilitate determination of the existence of any defects within the integrated circuit device attributable to the magnetostriction effects caused by the applied magnetic field.

16. The apparatus of claim 15, further comprising a burn-in chamber for retaining the integrated circuit device therein, the burn-in chamber accommodating the use of the magnetic field source in conjunction with burn-in testing of the integrated circuit device.

17. The apparatus of claim 16, wherein the burn-in chamber accommodates wafer level testing.

18. The apparatus of claim 16, wherein the burn-in chamber accommodates package level testing.

19. The apparatus of claim 15, wherein the magnetic field source comprises a permanent magnet.

20. The apparatus of claim 15, wherein the magnetic field source comprises an electromagnet.

* * * * *